United States Patent [19]

Havemann

[11] Patent Number: 4,816,423
[45] Date of Patent: Mar. 28, 1989

[54] BICMOS PROCESS FOR FORMING SHALLOW NPN EMITTERS AND MOSFET SOURCE/DRAINS

[75] Inventor: Robert H. Havemann, Garland, Tex.

[73] Assignee: Texas Instruments Incorporated, Dallas, Tex.

[21] Appl. No.: 45,978

[22] Filed: May 1, 1987

[51] Int. Cl.$^4$ .................. H01L 21/283; H01L 21/314
[52] U.S. Cl. ........................................ 437/31; 437/34; 437/40; 437/56; 437/57; 437/59; 437/189; 437/196; 437/200; 148/DIG. 9
[58] Field of Search ................ 437/31, 43, 57, 58, 437/160, 200, 189; 357/675; 148/DIG. 9

[56] References Cited

U.S. PATENT DOCUMENTS

| | | | |
|---|---|---|---|
| 3,887,993 | 6/1975 | Okada et al. | 437/200 X |
| 4,259,680 | 3/1981 | Lepselter et al. | 357/35 |
| 4,339,869 | 7/1982 | Reihl et al. | 437/200 X |
| 4,356,040 | 10/1982 | Fu et al. | 437/49 |
| 4,374,700 | 2/1983 | Scott et al. | 357/67 S |
| 4,450,620 | 5/1984 | Fuls et al. | 437/40 |
| 4,484,388 | 11/1984 | Iwasaki | 357/43 X |
| 4,487,706 | 11/1984 | Roche | 437/241 X |
| 4,505,027 | 3/1985 | Schwabe et al. | 437/245 X |
| 4,521,952 | 6/1985 | Riseman | 437/200 X |
| 4,545,116 | 10/1985 | Lau | 437/201 X |
| 4,558,507 | 12/1985 | Okabayashi et al. | 437/29 |
| 4,586,968 | 5/1986 | Coello-Vera | 437/162 X |
| 4,587,718 | 5/1986 | Haken et al. | 437/200 |
| 4,589,196 | 5/1986 | Anderson | 437/200 |
| 4,593,454 | 6/1986 | Baudrant et al. | 437/200 |
| 4,597,163 | 7/1986 | Tsang | 437/41 |
| 4,605,947 | 8/1986 | Price et al. | 357/23.15 |
| 4,609,568 | 9/1986 | Koh et al. | 437/162 X |
| 4,635,347 | 1/1987 | Lien et al. | 437/200 X |
| 4,657,628 | 4/1987 | Holloway et al. | 437/200 X |
| 4,703,552 | 11/1987 | Baldi et al. | 437/57 X |
| 4,705,599 | 11/1987 | Suda et al. | 437/200 X |
| 4,707,456 | 11/1987 | Thomas et al. | 437/200 X |
| 4,729,965 | 3/1988 | Tamaki et al. | 437/33 X |
| 4,732,872 | 3/1988 | Komatsu | 437/160 X |

OTHER PUBLICATIONS

Murarka, S. P., *Silicides for VLSI Applications*, Academic Press, Inc., Orlando, Fl., pp. 66–88 (1983).
Alperin et al., "Development of the Self-Aligned Trianium Silicide Process for VLSI Applications", *IEEE Trans. on Elec. Dev.*, vol. ED-32, No. 2, pp. 141–149 (Feb. 1985).
Tang et al., "VLSI Local Interconnect Level Using Titanium Nitride", *Technical Digest of IEDM*, pp. 590–593 (IEEE 1985).
Okabayashi, et al., "Low Resistance MOS Technology Using Self-Aligned Refractory-Silicidation", Digest of Technical Papers, IEDM 1982 (IEEE), pp. 556–558.

*Primary Examiner*—Brian E. Hearn
*Assistant Examiner*—Tom Thomas
*Attorney, Agent, or Firm*—Rodney M. Anderson; Leo N. Heiting; Melvin Sharp

[57] ABSTRACT

A method for forming a BICMOS device having MOS devices and bipolar devices formed during the same process includes the steps of first forming bipolar and MOS regions and then patterning gate electrodes in the MOS regions to define source/drain regions on either side thereof. A layer of oxide is formed over the bipolar transistor region which has an intrinsic base defined therein. The oxide is patterned to form an opening for an emitter and an opening for an extrinsic base, the opening separated by a layer of oxide. The refractory metal is then sputtered over the substrate and a silicide layer forms in the emitter and base regions of the bipolar transistor and the source/drain regions of the MOS transistors. The silicided layers are implanted with the refractory metal layer forming a mask on the sidewalls of the gate electrode of the MOS transistors and the portion of the refractory metal layer over the spacing oxide between the emitter and the base regions to mask the implanted impurities from the region in the silicon therebelow to provide a self-aligned process. The unreacted refraction metal is then removed and the impurities driven down to the substrate to define a metallurgical junction below the silicided layers.

18 Claims, 4 Drawing Sheets

BICMOS PROCESS FOR FORMING SHALLOW NPN EMITTERS AND MOSFET SOURCE/DRAINS

RELATED APPLICATION

This application is related to U.S. patent applications Ser. No. 057,871 filed June 2, 1987, Ser. No. 032,836 filed Mar. 31, 1987, and Ser. Nos. 008,906 and 008,910, both filed Jan. 30, 1987; all of these applications are assigned to Texas Instruments Incorporated.

TECHNICAL FIELD OF THE INVENTION

The present invention pertains in general to a BICMOS process for forming bipolar and MOS transistors and, more particularly, to a process for forming the emitter and base of an NPN device and the source and drain of an MOS device with shallow silicided junctions.

BACKGROUND OF THE INVENTION

The integration of FET structures, using p-channel transistors (PMOS) and n-channel transistors (NMOS), with bipolar transistors has seen increasing use in recent years. These devices are referred to as BICMOS devices. The use of the bipolar transistors as driving elements for the MOS devices improves the speed characteristics of the overall device. The bipolar transistors are characterized by high transconductance which is well suited for driving capacitive loads.

One disadvantage of integrating an MOS device and a bipolar device in the same circuit is that the steps in fabricating the bipolar device differ somewhat from the steps required to fabricate MOS devices. This may necessitate separate fabrication steps for the bipolar devices and the MOS devices which could result in an overly complex process, since numerous thermal cycles would be required. In order to accommodate these two processes, there has been a trend towards combining fabrication steps to form various elements of the two devices.

One of the more important structure in both the bipolar device and the MOS device are the semiconductor junctions which form the emitter and the base of the bipolar transistor and the source/drains of the MOS device. With present technology, these structures are implanted to provide a relatively thin region of impurities of the proper conductivity type and then the impurities are driven down into the substrate with subsequent annealing steps to form a metallurgical junction at a predetermined depth. However, formation of both the MOS device and the bipolar device requires these junctions to be accurately aligned with respect to other structures on the substrate. This alignment becomes somewhat difficult when junctions are formed at different steps in the process and when interceded by thermal cycles.

In view of the above disadvantages, there exists a need for an improved process for forming BICMOS devices wherein the emitter and base junctions in the bipolar device and the source/drain junctions of the MOS devices are fabricated with a minimum number of process steps and are exposed to a minimum number of thermal cycles in the process.

SUMMARY OF THE INVENTION

The present invention disclosed and claimed herein describes a process whereby two regions are defined in a substrate, one for forming a MOS transistor and one for forming an NPN bipolar transistor. After the regions are defined, a gate electrode is patterned in the MOS transistor and sidewall oxides are formed on the vertical walls thereof. Emitter and base openings are the patterned in an oxide layer on the surface of the bipolar transistor region to define an emitter region and a base region separated with an oxide layer. A layer of refractory metal such as titanium is then sputtered over the entire surface contacting the source/drain region of the MOS transistor and the emitter and base regions in the bipolar transistor. The refractory metal is then reacted to form a silicide on exposed portions of the silicon surfaces and the polysilicon surfaces.

After reaction of the titanium, n-type impurities are implanted into the emitter region of the bipolar transistor and the source/drain regions of NMOS type transistors and p-type impurities are implanted into the base region of the bipolar transistor and the source/drain regions of PMOS type transistors, such that the implanted impurities are imbedded into the silicide layers formed thereover. The unreacted refractory metal, in addition to the sidewall oxide surrounding the gate electrode of the MOS transistor, functions to offset the implanted impurities from the edge of the gate electrode and the underlying channel region, with the spacing oxide layer and the overlying unreacted refractory metal functioning to mask implanted impurities and prevent them from being implanted into the surface of the silicon between the emitter and the extrinsic base of the bipolar transistor. A subsequent annealing step drives the impurities embedded in the silicide layers downward into the substrate to form a metallurgical junction beneath the silicide layers.

The process of first forming silicide layers over the base and emitter regions of the bipolar transistor and the source/drain regions of MOS transistors provides a technical advantage by eliminating the number of steps required to form the various metallurgical junctions, with the junctions being formed in a single annealing step. An additional technical advantage is realized by implanting the impurities into the silicide layers and then subsequently driving the impurities downward into the substrate prior to removing unreacted refractory metal, this step providing shallow junctions. A further technical advantage is realized by forming the extrinsic base and the emitter region in a lateral spaced configuration separated by an oxide layer over which the refractory metal is sputtered. Implantation of dopants into the overlying refractory metal layer in conjunction with implanting into the silicide layer prevents the dopants from passing through the spacing oxide between the emitter region and the extrinsic base while the remaining impurities are driven down into the substrate to form the metallurgical junction. This step acts as a self-aligned mask to form the area between the extrinsic base and the emitter.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE INVENTION

Figure 1:
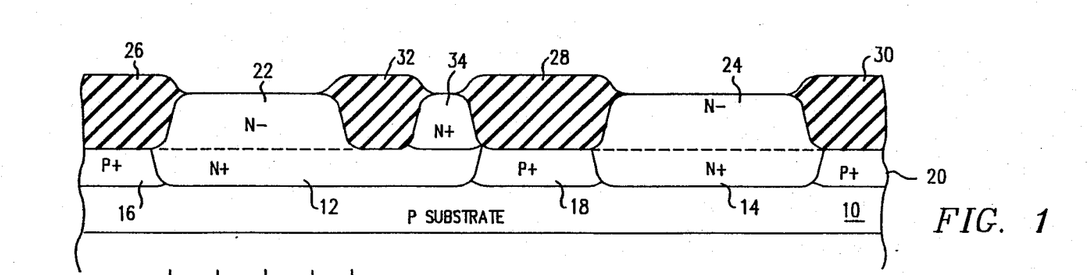
FIG. 1 illustrates a cross-sectional diagram of a silicon substrate after forming the MOS and bipolar regions with a buried collector.

Referring now to FIG. 1, there is illustrated a cross-sectional diagram of one step in the fabrication process for a BICMOS device illustrating the fabrication of an NPN transistor and a PMOS transistor. However, it should be understood that an NMOS transistor can also be fabricated in conjunction with the NPN transistor, as will be described in more detail hereinbelow.

In conventional fabrication of bipolar integrated circuits, a thin wafer of P-type semiconductor material, such as that identified by reference numeral 10 in FIG. 1, is provided and two n+ semiconductor areas 12 and 14 are formed by implanting an impurity such as antimony into the substrate with a dose of about $5 \times 10^{15}$ ions/cm$^2$ at an implant energy of approximately 40 Kev. The substrate is then subjected to an annealing step to drive the implanted areas 12 and 14 downward, followed by an implant of p-type impurities to form p-type regions 16, 18 and 20. The p-type regions are formed by implanting boron to a dosage of about $1 \times 10^{13}$ ions/cm$^2$ at an energy of 60 Kev. After formation of the n- and p-buried layers, an n-type epitaxial layer is formed on top of the substrate into which the tanks of the bipolar and MOS transistors will be formed. The epitaxial layer is implanted with an n-type impurity such as phosphorus to a dosage of approximately $1.5-2.5 \times 10^{12}$ ions/cm$^2$ at an energy of about 80 Kev and annealed to form an n- tank 22 which will be utilized for the bipolar transistor and an n- tank 24 to be utilized for the MOS transistor. Thick field oxide regions 26 and 28 are formed to isolate the bipolar transistor region with the thick field oxide region 28 and a thick field oxide region 30 operable to isolate the MOS transistor region. An additional thick field oxide layer 32 is provided between the field oxide regions 26 and 28 to define a collector region of the bipolar transistor region.

The field oxide is formed by subjecting the substrate to a steam oxidation step at approximately 900° Celsius to form an oxide thickness of approximately 8000 angstroms in thickness. Nitride selectively prevents growth of oxide over the n-regions 22 and 24 and also in a collector region 34. The collector region is selectively implanted with phosphorus to a dosage of approximately $2-3 \times 10^{16}$ ions/cm$^2$ at an energy level of about 100 Kev to make the collector region 34 n+, which region is referred to as a deep collector. The region 34 is a heavily doped region that extends into the n+ buried collector 12. Although not shown, a p- region can be formed adjacent the n- region 24 and separated by a region of thick field oxide into which an NMOS device can to be formed. For simplicity purposes, only the PMOS device will be described herein.

Figure 2:
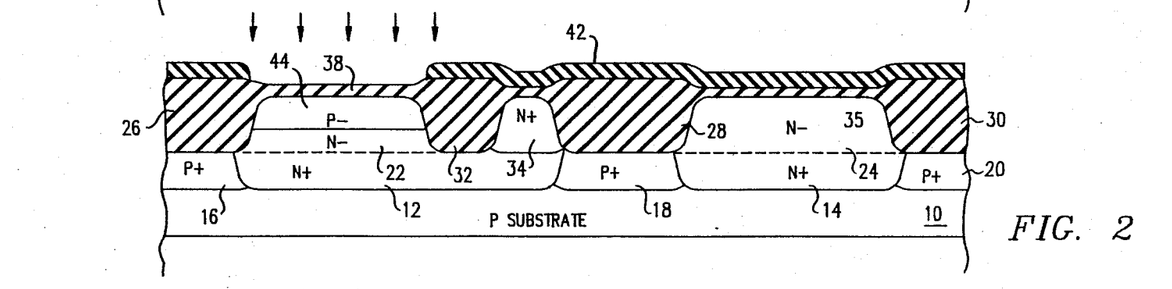
FIG. 2 illustrates a cross-sectional diagram illustrating the step of implanting the intrinsic base.

After formation of the structure illustrated in FIG. 1, the silicon surface in the n- tank 22 and the n- tank 24 are subjected to a wet etch to expose the silicon, and then the substrate 10 subjected to an oxidation environment, wherein a dummy gate oxide layer 35 is formed over the n- region 24, as illustrated in FIG. 2. The dummy gate oxide layer 35 is formed to a thickness of approximately 200-300 angstroms.

After formation of the dummy gate oxide layer 35, a nitride cap 42 is deposited on the substrate 10 and patterned to expose only the n- tank region 22 in the bipolar transistor. A layer of oxide 38 is formed over the n-tank 22 to a thickness of between 2000 Angstroms and then the substrate 10 subjected to an ion implant step to implant an intrinsic p- base region 44. This implant is conducted with a boron dosage of approximately $1-2 \times 10^{14}$ ions/cm$^2$ at an energy level of about 80 Kev. The implanted region 44 is initially a relatively thin region which becomes thicker with subsequent thermal processing steps. The nitride cap 42 is then stripped and the substrate subjected to a threshold adjust implant which is a relatively light implant. However, for simplicity purposes, the region 44 is shown in its final thickness relative to the n- tank 22.

Figure 3:
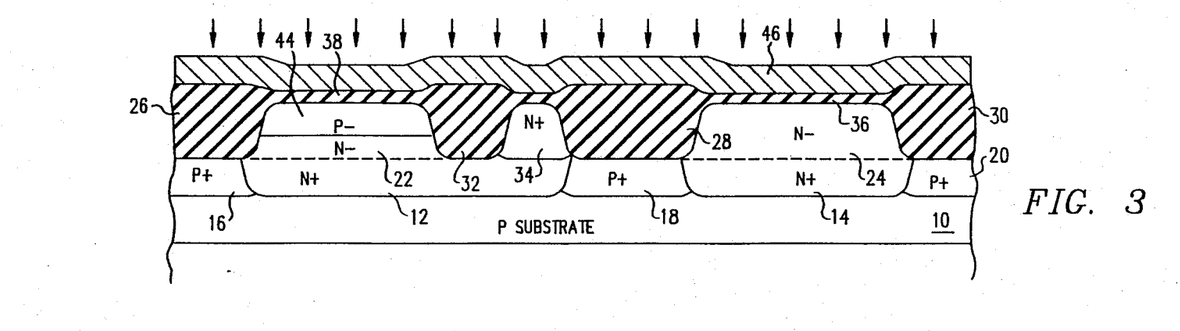
FIG. 3 illustrates the step of forming the poly crystalline silicon gates of the PMOS transistor.

After formation of the intrinsic p- base 44 and threshold implant, the dummy gate oxide layer 35 is removed and a layer 36 of gate oxide formed to a thickness of approximately 200 angstroms. A layer of polycrystalline silicon is then deposited to a thickness of approximately 4000 angstroms to form a layer 46. The result of the structure is illustrated in FIG. 3. The layer 46 is then implanted with an n-type impurity such as phosphorus at a dosage of $1.0 \times 10^{16}$ ions/cm$^2$ at an energy of 85 Kev to provide a doped polysilicon layer. The doped polysilicon layer 46 is then patterned and etched to provide a polysilicon gate electrode 48.

Figures 4, 5:
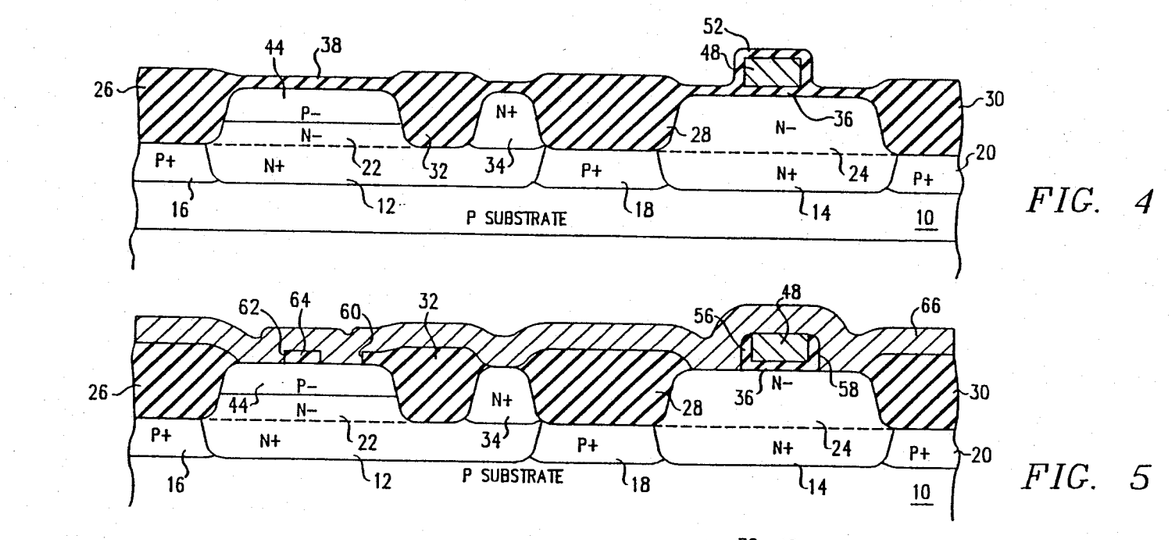
FIG. 4 illustrates the step of patterning the poly crystalline silicon and forming the sidewall oxides.
FIG. 5 illustrates the step of forming openings of the prospective emitter, base, collector and source and drain and sputtering a titanium layer onto the substrate.

After the gate electrode 48 is formed, a conformal oxide layer is either deposited or grown over the entire substrate to a thickness of approximately 300-500 angstroms, thereby encapsulating the electrode 48 with an oxide layer 52 on all sides thereof. The result of the structure is illustrated in FIG. 4. After deposition thereof, this layer is then subjected to an anisotropic etch to clear the oxide from flat surfaces including the surface of the deep collector 34. This etch leaves a sidewall oxide 56 on one side of the gate electrode 48 and a sidewall oxide 58 on the opposite side as shown in the cross-section of FIG. 4 thereof. In addition, the oxide layer 38 is patterned to allow the anisotropic etch to form an opening 60 and an opening 62 separated by an oxide layer 64. The purpose of the sidewall layers 56 and 58 is to seal the vertical surfaces of the gate electrode 48, as will be more clearly described hereinbelow. The process for forming sidewall oxides is described in U.S. Pat. No. 4,356,040 issued to Hornq-Sen Fu et al on Oct. 26, 1982 and assigned to Texas Instruments, Inc.

After forming the sidewall oxide layers 56 and 58 as illustrated in FIG. 4, a layer 66 of titanium which is a refractory metal, is sputtered onto the top of substrate 10 in a vacuum apparatus to a thickness of approximately 1000 angstroms. This is a conformal layer that will overlie the exposed polysilicon upper surface of the gate electrode 48, the exposed silicon on either side of the sidewall oxide layers 56 and 58, the exposed silicon surface of the deep collector 34 and the exposed silicon surfaces in the openings 60 and 62. Typically, sputtering of the titanium layer 66 is preceded by a wet etch in 1.0% hydrochloric acid to insure that no residual oxide remains on any of the exposed silicon or polysilicon.

Figure 6:
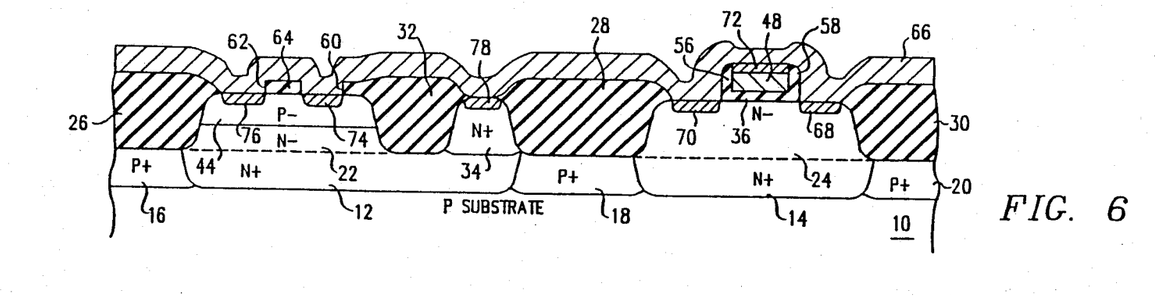
FIG. 6 illustrates the step of forming silicide layers on exposed silicon and polysilicon.

After formation of the titanium layer 66, the titanium is reacted at a temperature of approximately 675° Celsisus in an atmosphere of argon and nitrogen for approximately thirty minutes. This reaction allows the portion of the titanium layer 66 that is adjacent the silicon in the n- tank 24 to consume silicon and form titanium disilicide. In addition, the portion of the titanium layer 66 adjacent the exposed upper surface of the gate electrode 48, the exposed upper surface of the deep collector 34 and the exposed silicon in the openings 60 and 62 also consumes silicon and forms titanium disilicide. This reaction results in a thickness of titanium disilicide of approximately 1500 angstroms with a small portion of the titanium remaining unreacted on the surface. A silicide layer 68 is therefore formed between the edge of the sidewall oxide layer 58 and the edge of the field oxide 30 and a silicide layer 70 is formed between the edge of the sidewall oxide 56 and the edge of the field oxide layer 28 and a layer of silicide 72 is formed on the upper surface of the gate electrode 48. In a similar manner, a layer of silicide 74 is formed in the opening 60, a layer of silicide 76 is formed in the opening 62 and a layer of silicide 78 is formed in the upper surface of the deep collector 34.

The original titanium layer 66 is converted to titanium disilicide only in the silicide layers 68–78 with only portions of the titanium layer 66 remaining, which remaining portions overlie oxide. Since the titanium was reacted in an argon and nitrogen atmosphere, a portion of the exposed surface of the titanium in these regions will be converted to titanium nitride, with the portion of the unsilicided titanium adjacent the underlying oxide being converted to titanium oxide. The resultant structure is illustrated in FIG. 6.

Figure 7:
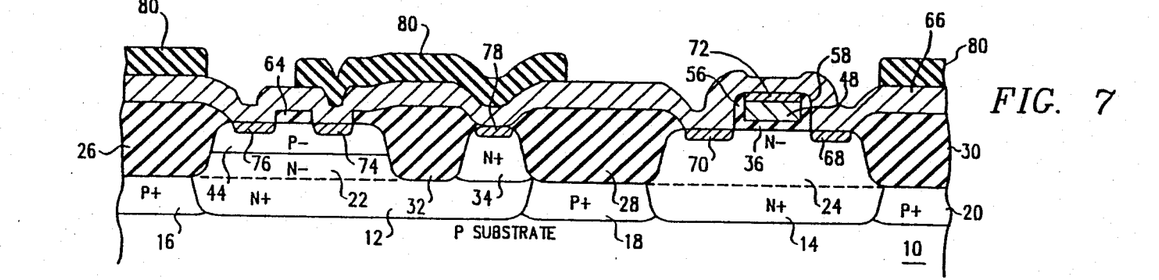
FIG. 7 illustrates the step of implanting the extrinsic base of the bipolar transistor and the source and drain of the PMOS transistor.

After the titanium is reacted with the exposed silicon and polysilicon surfaces to form titanium disilicide, the substrate 10 is covered with a layer of photoresist 80 to mask off the silicide layer 74 and the collector plug 34. An implant step is then performed to implant p-type impurities through the surface of the exposed portion of the titanium layer 66 and into the silicide layers 68, 70, 74 and 76. In addition, some p-type impurities will be implanted into the silicide layer 72 on the upper surface of the gate electrode 48. Although these impurities will be introduced into the polysilicon gate electrode 48 and therefore counter the effect of the already implanted impurities, the silicide layer 72 will still provide a highly conductive surface. The implanted p-type impurities can be any basic source/drain implant, and, in the preferred embodiment, the implant utilizes boron which is implanted at an energy of approximately 50 Kev with a dosage of approximately $5 \times 10^{15}$ ions/cm$^2$. This step is illustrated in FIG. 7.

Figure 8:
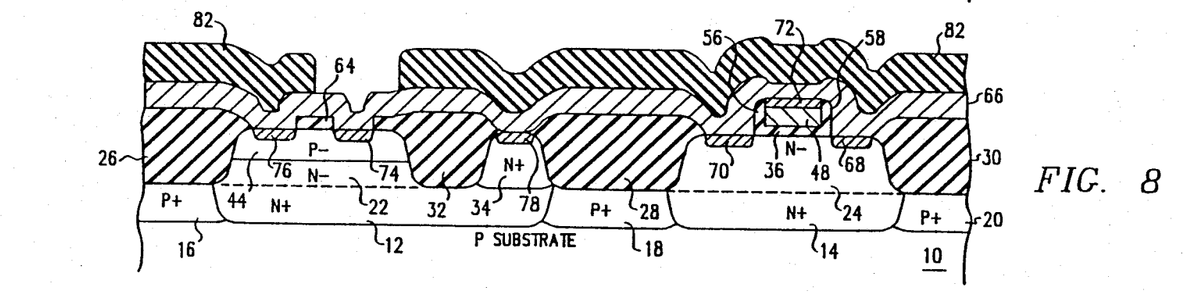
FIG. 8 illustrates the step of implanting the emitter of the bipolar transistor.

In FIG. 8, a subsequent step is provided whereby a layer of photoresistor 82 is spun onto the substrate 10 to mask off all portions of the substrate with the exception of the silicide layer 74 in the bipolar transistor to allow implanting of n-type impurities therein. However, although not described, the NMOS transistor would also be exposed to allow implantation of n-type impurities into the source/drain regions thereof in a similar manner to the step of implanting p-type impurities into the source/drains of the PMOS transistors.

After the photoresist layer 82 is formed, n-type impurities are implanted into the silicide layer 74 in a two step process. In the preferred embodiment, arsenic is utilized as the N-type impurity. The arsenic implant is a basic doubly charged implant with an energy of between 240–360 Kev to a dosage of approximately $3 \times 10^{15}$ ions/cm$^2$. Phosphorus is then implanted with a voltage of 110–180 Kev to a dose of $4 \times 10^{14}$ ions/cm$^2$. Alternatively, Phosphorus alone can be implanted at a dosage of approximately $3 \times 10^{15}$ ions/cm$^2$ at a voltage of 110–180 Kev. Although the voltages may vary, the object is to place the peak of the dopant profile after implantation at a predetermined depth in the silicide layers 68, 70, 74 and 76. In the preferred embodiment, this peak is placed as close to the junction formed between the silicide layers 68 and 70 and the n- layer 24 and the silicide layers 74 and 76 and the p- intrinsic base 44. The dosage of the n- and p-implants and the depth to which they are implanted is a function of the desired characteristics of both the bipolar and MOS transistors and may be adjusted accordingly.

Figure 8A:
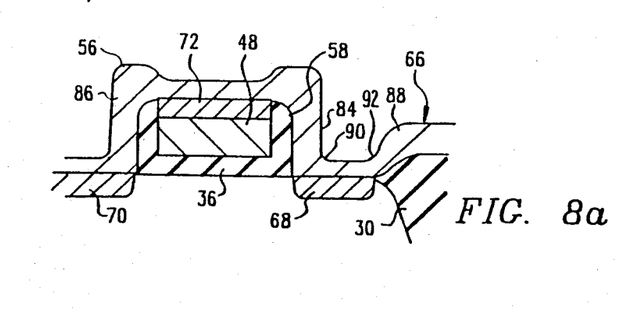
FIGS. 8a and 8b illustrate details of the silicide layer formation.

A detail of the silicide layer 68 and the sidewall oxide layers 56 and 58 is illustrated in FIG. 8a. As described above, after formation of the silicide layers 68–78, a portion of the titanium layer 66 remains that is not reacted to form titanium disilicide. This results in a portion 84 overlying the sidewall oxide layer 58, a portion 86 overlying the sidewall oxide layer 56 and a portion 88 overlying the field oxide layer 30. As described above, the portions 84, 86 and 88 react to form a combination of titanium nitride and titanium oxide. Since non-silicide portions of the titanium layer 66 remain on the substrate during the ion implantation step, the implanted impurities are spaced away from the edge of the sidewall oxide layer 58 and the edge of the field oxide layer 30. The impurities are only implanted into the substrate 10 between a point 90 and a point 92 in the surface of the silicide layer 68. The point 90 is spaced from the vertical side of the gate electrode 48 by a distance equal to the combined thickness of the sidewall oxide layer 58 and the portion 84 of the titanium layer 66.

Figure 8B:
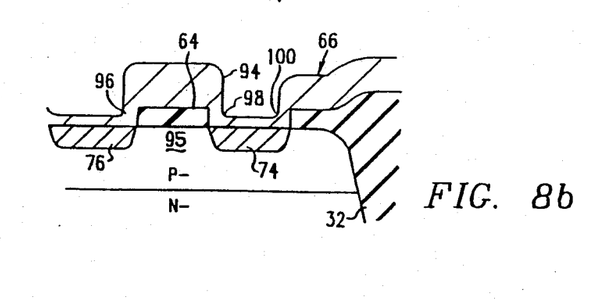

A detail of the silicide layers 74 and 76 formed in the bipolar transistor region is illustrated in FIG. 8b. The titanium layer 66, after reaction thereof to form titanium disilicide layers 74 and 76, leaves non-silicide portion 94 on the sidewall of oxide layer 64 adjacent silicide layer 74 and an unreacted portion 96 on the sidewall of oxide layer 64 adjacent the silicide layer 76. This results in the impurities being implanted into the silicide layer 74 only between a point 98 and a point 100.

In order to implant either p-type impurities into the silicide layer 76 or n-type impurities into the silicide layer 74, it is important that none of the impurities pass into the region between the two areas, which is indicated by reference numeral 95. This region 95 isolates silicide layer 74, which will comprise the emitter, and the silicide layer 76, which will comprise the extrinsic base after formation of the shallow junctions, as will be described hereinbelow. In order to prevent impurities from passing through to the region 95 in the p-intrinsic base 44, the energy of the p- and n-implants is such that it will be located within the portion of the titanium layer 66 overlying the oxide layer 64 spacing the silicide layers 74 and 76 away from each other. Once the majority of the impurities are implanted into the titanium layer 66 overlying the oxide layer 64, subsequent diffusion due to thermal cycling will be blocked in the downward direction by the oxide layer 64, since the diffusion coefficient of oxide is very low. In this manner, the oxide layer 64 performs the function of a mask with the photoresist layers 80 and 82 functioning only to prevent impurities from being implanted in the silicide layer 74 and the silicide layer 76, respectively.

Figure 9:
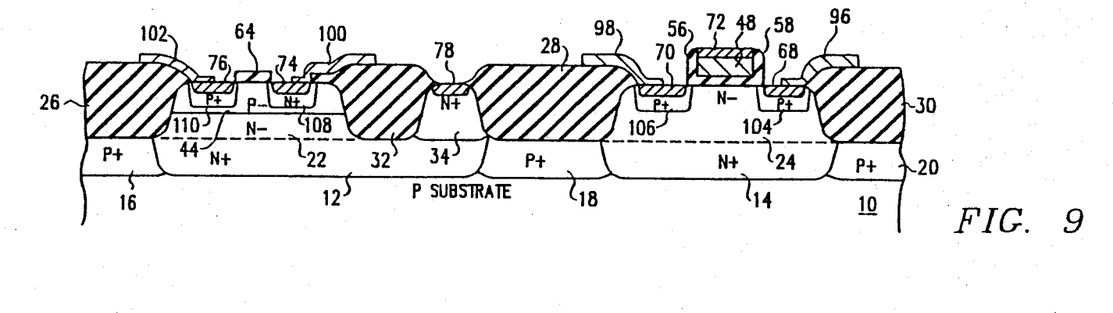
FIG. 9 illustrates the step of patterning the local interconnects.

After implanting n-type and p-type impurities into the silicide layers 74 and 76 and p-type impurities into the silicide layers 68 and 70, the substrate is then patterned to form local interconnects and then etched in an acid solution to remove the non-silicide portions of the titanium layer 66 that are not patterned for local interconnects. The titanium disilicide is not removed by this process, nor are the patterned portions of the titanium nitride. For example, a suitable etching in the case of titanium is a wet etch comprising a solution of $H_2SO_4$ and $H_2O_2$. Since titanium only reacts with silicon or polycrystalline silicon to form a silicide, the unpatterned portions covering the field oxide layers, the oxide layer 64 spacing the base and emitter and the sidewall oxide layers 56 and 58 have the titanium removed therefrom. The wet etch will attack both titanium nitride and titanium oxide, such that no conductive layer remains behind other than the patterned titanium nitride or the titanium disilicide. The resultant structure after removing the unpatterned portions of the unreacted titanium is illustrated in FIG. 9. The titanium disilicide process is described in U.S. Pat. No. 4,545,116 issued to C. K. Lau on Oct. 8, 1985, assigned to Texas Instruments, Inc.

The patterned titanium nitride will result in a local interconnect 96 connected at one end to the silicide layer 68 and overlying the field oxide layer 30, and a local interconnect 98 connected at one end to the silicide layer 70 and overlying the field oxide layer 28, a local interconnect 100 having one end thereof connected to the disilicide layer 74 and overlying the field oxide layer 32 and a local interconnect 102 having one thereof connected to the disilicide layer 76 and overlying the field oxide layer 26.

After the impurities are implanted in the silicide layers 68, 70, 74 and 76 and the unreacted and unpatterned titanium removed, the substrate is then annealed for thirty minutes at a temperature of approximately 800° Centigrade in an atmosphere of argon to stabilize and further lower the resistivity of the titanium disilicide. Titanium disilicide increases the conductivity of all silicon or polysilicon areas over which it was formed and constitutes a self aligned process. In addition, the impurities are driven down into the silicon of the substrate to form a metallurgical junction beneath the silicide layers 68, 70, 74 and 76.

Although the above process illustrates formation of the silicide layers 68, 70, 74 and 76 prior to implanting impurities therein, the impurities could be implanted into the titanium layer 66 prior to reaction to form silicide. Thereafter, the reaction to form the silicide layers 68, 70, 74 and 76 is performed followed by driving the impurities into the substrate. However, the length of the thermal cycle can be increased in the reaction step to form both the silicide and the underlying junctions.

When the dopant that was originally implanted into the silicide layers 68, 70, 74 and 76 adjacent the lowermost junction is diffused outward and downward into the substrate by the annealing step, there will be diffusion in two directions. The first direction will be downward into the substrate and the second direction will be lateral. The downward diffusion is termed the "depth". In the preferred embodiment, and after all thermal cycling in the substrate is complete, this will result in a junction which is approximately 1500 angstroms deep with a lateral diffusion of approximately 1000 angstroms. This forms a p+ region 104 beneath the silicide layer 68, a p+ region 106 beneath the silicide layer 70, an n+ region 108 beneath the silicide layer 74 and a p+ region 110 beneath the silicide layer 76. The p+ regions 104 and 106 form the source/drain junctions of the PMOS transistor, the n+ region 108 forms the emitter and the P+ region 110 forms the extrinsic base of the NPN bipolar transistor.

With further reference to FIG. 9, it can be seen that the edge of the p+ regions 104 and 106 adjacent the channel region underlying the gate electrode 48 is offset from the edge of the gate by a dimension which is determined by the thickness of the sidewall oxide layers 56 and 58 and the thickness of the titanium layer 66 that was sputtered onto the substrate. The offset is a matter of design choice and is utilized to account for the lateral diffusion of the p+ regions 104 and 106. The edge of the p+ regions 104 and 106 are nominally aligned with the edges of the channel region underlying the gate electrode 48.

With respect to the p+ region 110 and the n+ region 108 in the bipolar transistor, it is only desirable that the distance between the edges of the two regions that are proximate each other be approximately 1500 to 2500 angstroms. Since the openings 60 and 62 that are defined in the oxide to form the oxide layer 64, as illustrated in FIG. 6, are patterned in one step, this results in a self aligning step, wherein a predetermined distance is formed between the base and the emitter regions. However, it is still necessary to insure that the photoresist layers 80 and 82, as illustrated in FIGS. 7 and 8, completely overlie the respective one of the openings 60 or 62 that is to be masked off. With one micron and up technology, this is easily achievable.

Figure 10:
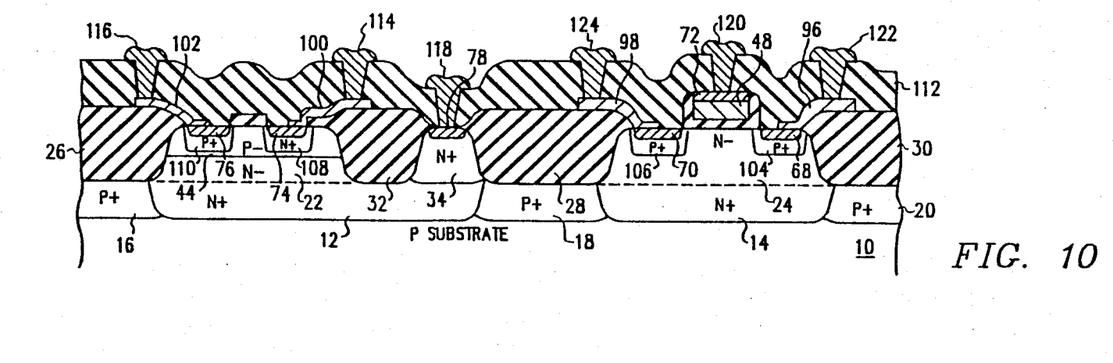
FIG. 10 illustrates the step of forming the interlevel oxide and contacts.

After the p+ regions 68 and 70 which form the source/drain junctions are formed and the p+ region 110 and the n+ region 108 are formed in the bipolar transistor, an interlevel of oxide is deposited over the surface of the substrate, and then masked and patterned to form openings for metal transistor contacts. This is illustrated in FIG. 10. This results in a layer of interlevel oxide 112 being formed over the substrate. A base contact 116 is formed through the interlevel oxide 112, and emitter contact 114 and a collector contact 118 are also formed. The PMOS transistor has a gate contact 120 formed in contact with the silicide layer 72 overlying the upper surface of the gate electrode 48 and source/drain contacts 122 and 124 contacting the local interconnects 96 and 98, respectively.

In summary, there is provided a process whereby two regions are defined in a substrate, one for forming an MOS transistor and one for forming an NPN bipolar transistor. After the regions are defined, a gate electrode is patterned in the MOS transistor and sidewall oxides are formed on the vertical walls thereof. Emitter and base openings are patterned in the surface of the bipolar transistor region to define an emitter and base separated with an oxide layer. A layer of titanium is then sputtered over the entire surface contacting the source/drain regions of the MOS transistor and the emitter and base regions in the bipolar transistor. The titanium is then reacted to form titanium disilicide on exposed portions of the silicon surface and the polysilicon surfaces. Thereafter, n-type impurities are implanted into the emitter of the bipolar transistor and the source/drain regions of the MOS transistors, if an NMOS transistor is being formed, and p-type impurities implanted into the base of the bipolar transistor and the source/drain regions of the MOS transistors, if a PMOS transistor is being formed, such that the implanted impurities are imbedded into the silicide layers formed thereover. The unreacted titanium, in addition to the sidewall oxide surrounding the gate of the MOS transistor, functions to offset the implanted impurities from the edge of the gate electrode and the underlying channel region, with the spacing oxide layer and the overlying unreacted titanium layer functioning to mask implanted impurities and prevent them from being implanted into the surface of the silicon between the emitter and the extrinsic base of the bipolar transistor. A subsequent annealing step drives the impurities imbedded in the silicide layers downward into the substrate to form a metallurgical junction beneath the silicide layers.

Although the preferred embodiment has been described in detail, it should be understood that various changes, substitutions and alterations can be made therein without departing from the spirit and scope of the invention as defined by the appended claims.

What is claimed is:

1. A method for forming a bipolar transistor and a field effect transistor at a surface of a silicon substrate, comprising:
    forming in a first area of the surface a bipolar region, said bipolar region having an intrinsic base of the first conductivity type at said surface and a collector of a second conductivity type;
    defining in a second area of the surface an MOS region of said second conductivity type;
    forming a polycrystalline silicon gate electrode in said MOS region and separated from the surface of the substrate by a gate oxide layer, source and drain regions being defined on either side of the gate electrode;
    exposing the source/drain regions;
    forming a layer of oxide in the first area over the intrinsic base region;
    forming an emitter opening and a base opening in said layer of oxide to expose the underlying surface at the intrinsic base region, said emitter opening and said base opening separated by a remaining portion of the oxide layer;
    forming a layer of refractory metal over the surface and contacting the exposed silicon surfaces;
    reacting the refractory metal to form a silicide film at the source and drain regions of the MOS region and at the base opening of the bipolar region;
    masking said emitter opening with a masking material;
    simultaneously implanting impurities of the first conductivity type into the silicide film formed at the source and drain regions of the MOS region and at the base opening;
    doping the surface of said intrinsic base at the location of said emitter opening with dopant of the second conductivity type;
    removing non-silicide portions of the refractory metal layer after the implanting step; and
    driving the impurities implanted into the silicide at said source and drain regions of said MOS region and at the base and emitter openings of said bipolar region downward therefrom to form p-n junctions therebelow.

2. The method of claim 1 further comprising the step of forming sidewall oxide on the sidewalls of the gate electrode, comprising:
    depositing a layer of oxide over the gate electrode; and
    anisotropically etching the oxide to remove all the oxide except on the surfaces of the gate electrode which are substantially perpendicular to the surface of the substrate in the MOS region.

3. The method of claim 1 wherein the step of forming the emitter and base openings in the layer of oxide over the first area comprises:
    depositing a layer of oxide over the substrate to a predetermined thickness; and
    patterning and etching the base and emitter openings in the formed layer of oxide.

4. The method of claim 1 wherein the steps of implanting impurities of the first conductivity type comprises implanting the impurities to a depth in the silicide layer in the base opening such that the impurities are also implanted in the non-silicided refractory metal layer overlying the oxide spacing apart the emitter and base openings, such implant depth not exceeding the depth of the overlying non-silicided refractory metal.

5. The method of claim 1 wherein the refractory metal comprises titanium and the silicide comprises titanium disilicide.

6. The method of claim 1 wherein the step of driving the impurities comprises annealing the substrate.

7. The method of claim 1 wherein the refractory metal is in contact with the intrinsic base at the location of said emitter opening so that said reacting step also forms a silicide film at the location of said emitter opening;
    and wherein the step of doping the surface of said intrinsic base at the location of said emitter opening comprises:
    masking off the portion of the surface into which impurities of the second conductivity type are not to be implanted; and
    implanting impurities of the second conductivity type into the surface such that the impurities are implanted into the silicide film at said emitter opening.

8. The method of claim 1 wherein the step of forming the emitter and base openings also comprises exposing the silicon surface overlying the deep collector such that silicide is formed thereover to provide a collector contact and implanting impurities of the second conductivity type into the collector opening.

9. The method of claim 8 wherein the step of forming the gate electrode comprises:
    forming a layer of gate oxide over the substrate;
    depositing a layer of polycrystalline silicon over the gate oxide layer; and
    patterning the layer of polycrystalline silicon to form the gate electrode.

10. The method of claim 1 and further comprising: forming field oxide structures at said surface to define said bipolar region and the MOS region.

11. A method for forming a shallow silicided base and emitter junction in a bipolar transistor formed at a surface of a silicon substrate, in conjunction with a field effect transistor formed at said surface, comprising:

forming an n-type buried collector with a deep collector connection to said surface in a first area of the surface of said substrate;

forming an intrinsic p-type base region overlying the buried collector;

forming an n-type MOS region at the surface of the substrate isolated from the first area;

forming a layer of gate oxide over the MOS region;

forming a layer of polycrystalline silicon over the gate oxide layer;

removing selected portions of the layer of polycrystalline silicon to form a gate electrode;

forming an oxide layer over the intrinsic base region;

exposing a source area and a drain area of said surface on opposite sides of said gate electrode in said MOS region, and exposing a base area in the base region, and an emitter area in the base to expose the surface of the silicon thereat, the base area separated from the emitter area by a remaining portion of said oxide layer;

forming a layer of titanium over the surface of the substrate and contacting the exposed surface of the silicon at the source, drain, base and emitter areas;

reacting the portions of the layer of titanium contacting the exposed surface of the silicon at the source, drain, base and emitter areas to form corresponding layers of titanium silicide thereat;

masking off the silicided layers at the emitter area and simultaneously implanting p-type impurities into the silicide layers in the base area, and the source and drain areas in said MOS region;

masking off the silicide layers in the MOS region and in the base area and implanting n-type impurities into the emitter area such that the n-type impurities are implanted into the silicide layer in the emitter area;

after the implanting step, removing selected portions of the titanium layer not reacted to form silicide to form local interconnects with the remaining portions thereof; and driving the impurity materials to form p-n junctions beneath the silicide layers.

12. The method of claim 11 wherein the n-type MOS region is separated from the first area by a layer of field oxide and the base region is separated from the deep collector by a layer of field oxide.

13. The method of claim 11 wherein
the step of forming the intrinsic base comprises implanting into the first area p-type impurities such that they will pass through the gate oxide layer to form the intrinsic base.

14. The method of claim 12 and further comprising doping the layer of polycrystalline silicon n-type after formation thereof to increase the conductivity thereof.

15. The method of claim 11 further comprising:
depositing a layer of oxide over the gate electrode prior to the exposing step.

16. The method of claim 11 wherein the step of implanting n-type and p-type impurities into the silicide layers comprises implanting the impurities to a depth in the respective silicide layers such that the impurities are not implanted through the layer of non-silicide titanium overlying the layer of oxide separating the base area and the emitter area in the base region.

17. The method of claim 11 wherein the step of forming the layer of titanium comprises sputtering titanium onto the surface of the substrate.

18. The method of claim 11 wherein the step of driving the impurities comprises annealing to cause the impurities to diffuse downward from the surface of the substrate and also to decrease the surface resistivity of the silicide.

* * * * *